United States Patent [19]

Ruka et al.

[11] 4,057,101
[45] Nov. 8, 1977

[54] HEAT SINK

[75] Inventors: Roswell J. Ruka, Pittsburgh; Robert G. Charles, Allison Park, both of Pa.

[73] Assignee: Westinghouse Electric Corporation, Pittsburgh, Pa.

[21] Appl. No.: 665,599

[22] Filed: Mar. 10, 1976

[51] Int. Cl.² .......................... C09K 5/06; H01B 7/34
[52] U.S. Cl. .................... 165/1; 165/104 S; 165/DIG. 4; 174/16 HS; 252/70; 357/82; 361/386; 361/388
[58] Field of Search .............. 252/70, 71; 126/400; 165/104 M, 104 S, 80, 1, DIG. 4; 357/82; 174/16 HS; 361/386, 388

[56] References Cited

U.S. PATENT DOCUMENTS

| | | | |
|---|---|---|---|
| 1,338,750 | 5/1920 | Schranck et al. | 126/400 |
| 2,677,367 | 5/1954 | Telkes | 126/400 X |
| 2,967,984 | 1/1961 | Jamison | 165/104 S X |
| 3,013,104 | 12/1961 | Young | 126/400 X |
| 3,077,539 | 2/1963 | Blau et al. | 126/400 X |
| 3,148,676 | 9/1964 | Truog et al. | 165/DIG. 4 X |
| 3,720,198 | 3/1973 | Laing et al. | 126/400 |
| 3,780,356 | 12/1973 | Laing | 165/104 S X |

Primary Examiner—Harris A. Pitlick
Attorney, Agent, or Firm—R. D. Fuerle

[57] ABSTRACT

A heat sink is disclosed which consists of a permanently sealed container which contains $LiClO_4.3R_2O$, $NH_4Al(SO_4)_2.12R_2O$ or $(COOH)_2.2R_2O$, where R is hydrogen or deuterium. The heat sink can be used in combination with a radiator to protect electronic circuitry or other equipment from temporary overheating.

8 Claims, 1 Drawing Figure

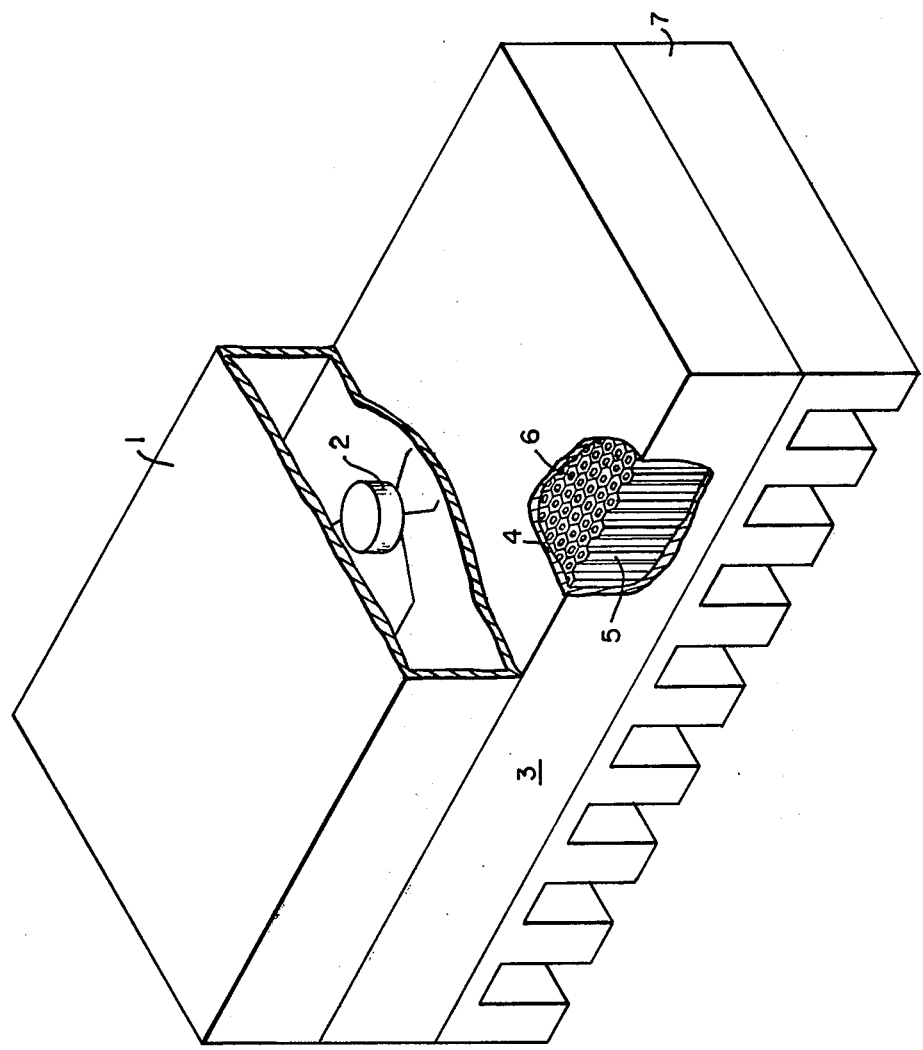

HEAT SINK

BACKGROUND OF THE INVENTION

When a substance changes from a solid to a liquid at its transition temperature it absorbs a quantity of heat known as the heat of fusion. This heat of fusion is released when the substance solidifies again. A substance having a large heat of fusion can be used as a heat sink. In the presence of temperatures in excess of the transition temperature of the fusible material the heat sink will remain at the transition temperature until all of the material has melted. Thus, a heat sink can offer protection against temporary overheating by storing the excess heat until it can be radiated away. It is sometimes used, for example, to protect electrical apparatus from temporary overheating. Each heat sink is designed to prevent a temperature rise above the safe temperature of the apparatus to be protected and is made large enough to store the expected quantity of excess heat. Since electrical apparatus often operates more efficiently at higher temperatures, the transition temperature of the fusible material should be below but as close to the safe temperature as possible.

Thus, a good fusible material for a heat sunk must melt at the desired temperature and have a large heat of fusion per unit weight or per unit volume, depending on whether weight or volume considerations are more important. Another important property of a suitable material is the absence of a tendency to supercool. One fusible material, sodium acetate trihydrate, for example, partially supercools each time it re-solidifies, leaving less and less material available for use as a heat sink. Supercooling can be avoided by seeding the melt, but the system is more complex.

STATE OF THE PRIOR ART

U.S. Pat. No. 3,720,198 shows a honeycomb structure in a heat sink.

U.S. Pat. No. 3,834,456 discloses various hydrates as heat-sink materials.

Potassium aluminum disulfate dodecahydrate is a known heat sink material.

SUMMARY OF THE INVENTION

We have found that lithium perchlorate trihydrate, ammonium aluminum disulfate dodecahydrate, and oxalic acid dihydrate are excellent heat sink materials. We have also found that the corresponding deuterates are excellent heat sink materials, that their transition temperatures are different, and that a continuous range of transition temperatures can be obtained using deuterate-hydrate mixtures.

Oxalic acid dihydrate has the highest known experimentally determined heat of fusion per unit weight of any material between 2° and 100° C, to the best of our knowledge. Lithium perchlorate trihydrate and ammonium aluminum disulfate dodecahydrate both have high heats of fusion in the 90°–95° C range, where few other suitable materials are available. Though the re-solidifying characteristics of ammonium aluminum disulfate dodecahydrate have not yet been thoroughly explored, both oxalic acid dihydrate and lithium perchlorate trihydrate have been found to re-solidify with very little tendency to supercool.

BRIEF DESCRIPTION OF THE DRAWINGS

The accompanying FIGURE is an isometric view, partially in section, of a package of electronic or other equipment, a heat sink, and a radiator.

In the drawing a container 1 holds electronic or other equipment 2, which is subject to temporary overheating. When overheating occurs, the excess heat is absorbed by heat sink 3. The heat sink consists of permanently sealed container 4 which has a honeycomb internal structure 5 of a heat-conducting metal which transfers the heat throughout the heat sink. Aluminum is preferred for the honeycomb structure because of its low density, though copper and other conductors could also be used. Within and around the honeycomb structure is a fusible material 6 according to this invention, which absorbs the excess heat as it melts. The heat is then transferred by the honeycomb structure to radiator 7 where it is dissipated.

The heat sink is preferably permanently sealed to prevent the escape of water of hydration, which would lead to the formation of anhydrous compounds not suitable for use as heat sinks.

Many variations on the above-described apparatus are also contemplated. For example, the source of heat can be separated from the heat sink, heat being transferred between them with a fluid, such as water, moving in a closed loop. A second closed loop can be used to transfer heat from the heat sink to the radiator. The heat source and radiator can also be combined so that the heat source is kept hotter longer by radiating heat from the heat sink. In addition to protecting equipment from overheating, the heat sink may also be used simply to store heat. For example, power generated when demand for it is low can be stored as heat which is used to generate power during peak hours, and heat from sunlight can be stored for use at night.

The fusible materials of this invention have the general formulae $LiClO_4.3R_2O$, $NH_4Al(SO_4)_2.12R_2O$, and $(COOH)_2.2R_2O$, where each R is independently selected from 0 to 100% hydrogen and 0 to 100% deuterium. The following table gives the properties of compounds which have been tested:

| Compound | Melting Temperature (° C) | Heat of Fusion cal/gram | Heat of Fusion cal/cm³ |
|---|---|---|---|
| $NH_4Al(SO_4)_2 . 12H_2O$ | 93.5 | 64 | 105 |
| $LiClO_4 . 3H_2O$ | 95 | 67 | 123 |
| $(COOH)_2 . 2H_2O$ | 101.5 | 91–94 | 150–155 |
| $(COOH)_2 . 2D_2O$ | 94 | 83 | |

The above hydrates can be purchased commercially, but they and the dideuterate were prepared by heating the corresponding anhydrous compound with stoichiometric amounts of water or deuterium oxide until dissolution. Mixtures of deuterates and hydrates (e.g., $(COOH)_2.3/2H_2O.\frac{1}{2}D_2O$) can be made in the same way to achieve intermediate melting temperatures. Lithium perchlorate trihydrate and oxalic acid dihydrate have been found to freeze with little tendency to supercool or form the anhydrous compound. The other materials have not been as yet fully tested. Oxalic acid dihydrate is readily available at a low price, can be transferred in the presence of air and water vapor at room temperature, and requires no special handling. Lithium perchlorate trihydrate is an oxidizing agent and may explode in the presence of oxidizable materials. Isolated, however, it is very stable even at temperatures above its melting point. Both lithium perchlorate trihydrate and aluminum ammonium disulfate dodecahydrate are relatively inexpensive and can be handled conveniently in air.

What is claimed is:

1. A method of storing heat comprising repeatedly transferring heat to a heat sink which comprises a compound selected from the group consisting of $LiClO_4.3R_2O$ and $(COOH)_2.2R_2O$, where 100% of each R is independently selected from 0 to 100% hydrogen and 0 to 100% deuterium.

2. A method according to claim 1 wherein said compound is $LiClO_4.3H_2O$.

3. A method according to claim 1 wherein said compound is $(COOH)_2.2H_2O$.

4. A method according to claim 1 wherein said compound is $(COOH)_2.2D_2O$.

5. A method of protecting electronic circuitry from temporary overheating comprising (1) transferring heat from said circuit to a heat sink comprising a compound selected from the group consisting of $LiClO_4.3R_2O$ and $(COOH)_2.2R_2O$, where 100% of each R is independently selected from 0 to 100% hydrogen and 0 to 100% deuterium; and (2) radiating said heat away from said heat sink.

6. A method according to claim 5 wherein said compound is $LiClO_4.3H_2O$.

7. A method according to claim 5 wherein said compound is $(COOH)_2.2H_2O$.

8. A method according to claim 5 wherein said compound is $(COOH)_2.2D_2O$.

* * * * *